(12) United States Patent
Ma et al.

(10) Patent No.: US 10,937,663 B2
(45) Date of Patent: Mar. 2, 2021

(54) SELECTIVE PHOTORESIST ETCHING FOR BRIDGE DEFECT REMOVAL

(71) Applicant: Varian Semiconductor Equipment Associates, Inc., Gloucester, MA (US)

(72) Inventors: Tristan Y. Ma, Lexington, MA (US); Juiyuan Hsu, Ithaca, NY (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 414 days.

(21) Appl. No.: 16/140,916

(22) Filed: Sep. 25, 2018

(65) Prior Publication Data

US 2020/0098589 A1 Mar. 26, 2020

(51) Int. Cl.
| | |
|---|---|
| *H01L 21/311* | (2006.01) |
| *H01L 21/027* | (2006.01) |
| *H01L 21/308* | (2006.01) |
| *H01L 21/3213* | (2006.01) |
| *G03F 7/09* | (2006.01) |

(52) U.S. Cl.
CPC .... *H01L 21/31144* (2013.01); *H01L 21/0273* (2013.01); *H01L 21/0274* (2013.01); *H01L 21/3081* (2013.01); *H01L 21/32139* (2013.01)

(58) Field of Classification Search
CPC ........... H01L 21/31144; H01L 21/0273; H01L 21/0274; H01L 21/32139; H01L 21/3081; H01L 21/31138; G03F 7/405; G03F 7/40; G03F 7/094

USPC .......................................................... 438/759
See application file for complete search history.

(56) References Cited

U.S. PATENT DOCUMENTS

| | | | | |
|---|---|---|---|---|
| 6,090,507 | A * | 7/2000 | Grenon .............. | B23K 26/0624 430/5 |
| 6,340,543 | B1 * | 1/2002 | Nagamura ................ | G03F 1/72 430/5 |
| 2008/0193861 | A1 * | 8/2008 | Jeong ........................ | G03F 1/72 430/5 |
| 2008/0280213 | A1 * | 11/2008 | Oh ............................ | G03F 1/72 430/5 |
| 2017/0352144 | A1 * | 12/2017 | Yu .............................. | G06T 7/11 |

* cited by examiner

*Primary Examiner* — Caleen O Sullivan
(74) *Attorney, Agent, or Firm* — Kacvinsky Daisak Bluni PLLC

(57) ABSTRACT

Disclosed are methods for removing bridge defects using an angled implant and selective photoresist etch. In one embodiment, a method includes providing a semiconductor device including plurality of photoresist lines on a stack of layers, wherein a bridge defect extends between two or more photoresist lines of the plurality of photoresist lines. The method may further include implanting a sidewall and an upper surface of the two or more photoresist lines with an ion beam disposed at an angle, the angle being a non-zero angle of inclination with respect to a perpendicular to a plane of the upper surface of the stack of layers. The method may further include etching the semiconductor device to remove the bridge defect.

20 Claims, 3 Drawing Sheets

SELECTIVE PHOTORESIST ETCHING FOR BRIDGE DEFECT REMOVAL

FIELD

The present embodiments relate to processing methods, and more particularly, to selective photoresist etching for bridge defect removal.

BACKGROUND

In the integrated circuit (IC) industry today, billions of semiconductor devices are built on a single substrate, generally referred to as a wafer. The current demands for high density and performance associated with ultra large-scale integration entail the use of submicron features, increased transistor and circuit speeds and improved reliability.

The presence of bridge defects, or nano-bridging, is becoming one of the biggest sources of wafer defects during the lithography step for advanced nodes. Bridge defects are especially prevalent in EUV lithography, where dose limitation and high photon absorption rate make the process particularly prone to bridge defects at the bottom of the features because of underdeveloped photoresist. Various post-processing methods have been attempted by the industry, though are ineffective since because processes to remove the bridges also consumes the photoresist. Consuming the photoresist indiscriminately results in resist loss in height, resulting in difficult etch pattern transfers.

Therefore, there is an ongoing need to more effectively remove bridge defects.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, a method may include providing a semiconductor device including plurality of photoresist lines on a stack of layers, wherein a bridge defect extends between two or more photoresist lines of the plurality of photoresist lines. The method may further include implanting a sidewall surface and an upper surface of the two or more photoresist lines with an ion beam disposed at an angle. The angle may be a non-zero angle of inclination with respect to a perpendicular to a plane of an upper surface of the stack of layers. The method may further include etching the semiconductor device to remove the bridge defect.

In another embodiment, a method for removing photoresist defects may include providing a semiconductor device including plurality of photoresist lines on a stack of layers, wherein a bridge defect extends between two or more photoresist lines of the plurality of photoresist lines. The bridge defect may be present along an upper surface of the stack of layers. The method may further include forming a treated layer along just a sidewall surface and an upper surface of the two or more photoresist lines by implanting just the sidewall surface and the upper surface of the two or more photoresist lines with an ion beam disposed at an angle. The angle may be a non-zero angle of inclination with respect to a perpendicular to a plane of the upper surface of the stack of layers. The method may further include etching the semiconductor device to remove the bridge defect.

In yet another embodiment, a method for selectively removing photoresist defects may include providing a semiconductor device including a plurality of photoresist lines on a stack of layers. A bridge defect may extend between two or more photoresist lines of the plurality of photoresist lines, and wherein the bridge defect is present along an upper surface of the stack of layers. The method may further include forming a treated layer along just a sidewall and an upper surface of the two or more photoresist lines by implanting the sidewall and the upper surface of the two or more photoresist lines with an ion beam disposed at an angle. The angle is a non-zero angle of inclination with respect to a perpendicular to a plane of the upper surface of the stack of layers, wherein the angle prevents the ion beam from implanting the bridge defect. The method further includes etching the semiconductor device to remove the bridge defect.

Figure 1:
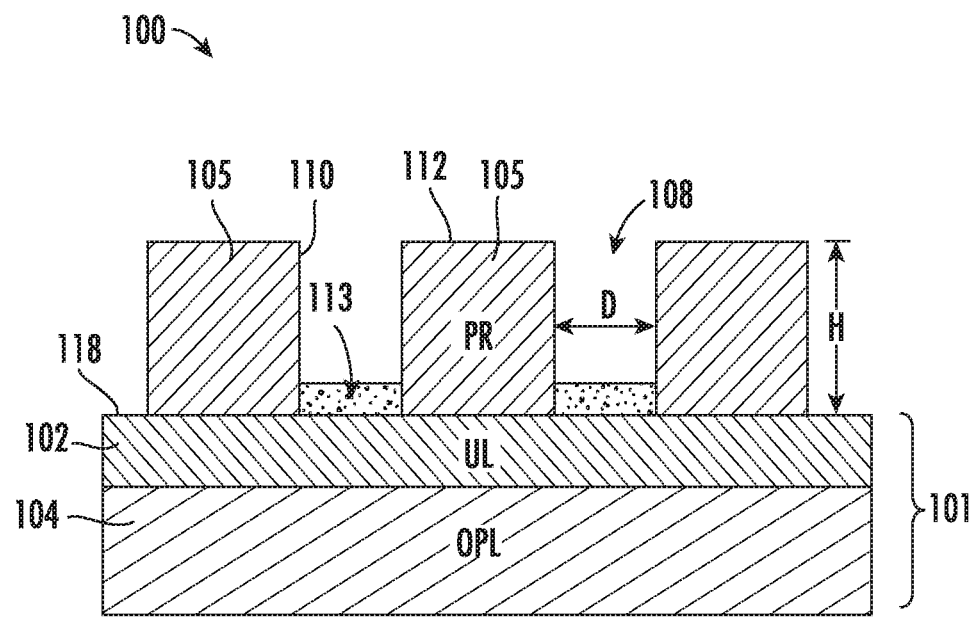
FIG. 1 depicts a side cross-sectional view of a semiconductor device including a plurality of photoresist lines atop a stack of layers in accordance with an embodiment of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods in accordance with the present disclosure will now be described more fully hereinafter with reference to the accompanying drawings, where embodiments of the methods are shown. The methods may be embodied in many different forms and are not to be construed as being limited to the embodiments set forth herein. Instead, these embodiments are provided so this disclosure will be thorough and complete, and will fully convey the scope of the system and method to those skilled in the art.

Current art approaches do not effectively address bridge defects (also referred to herein as nano-bridges). Often the EUV dose is significantly increased, thus reducing wafer throughput. The general approach is to perform a plasma descum step, thus consuming photoresist indiscriminately and resulting in resist loss in height, resulting in difficult etch pattern transfers. Another current art approach includes selectively depositing a protective carbon cap over the resist lines without capping the bridges, thus allowing the bridge defects to be removed without consuming the resist lines. The results are mixed though due to the difficulties in achieving selective deposition.

Yet another current art approach is to first etch transfer resist patterns into a hardmask layer, and then use angled etch to selectively remove the bridges. With this approach, bridges at the resist level are often no longer bridges after being transferred into the hardmask. Instead, the bridges manifest themselves in the form of poor LER, tilted sidewalls, footing, broken lines, etc., and thus cannot be readily corrected by etching. Bridge removal at the resist level is therefore an ideal solution provided by the present disclosure.

Specifically, embodiments of the present disclosure use angled ion implantation to increase the etch resistance of the photoresist without affecting the bridges, thus allowing the selective etch of bridge defects later without significant loss of photoresist. For example, ions are implanted into photoresist lines at an angle so the ions only hit the top and sidewall of a photoresist line, and not the bridges and/or undeveloped resist near the bottom of the trench. This selectively improves the resist's etch resistance. In some embodiments, where the wafer is etched using a plasma descum chemistry (e.g., $O_2$ or $H_2$ plasma), the bridge defects are removed, while the resist lines remain protected, achieving the desired bridge defect removal.

Turning now to FIG. 1, there is shown a cross-sectional view of a semiconductor device (hereinafter "device") 100 according to various embodiments of the disclosure. As shown, the device 100 includes a stack of layers 101 including an underlayer (UL) 102 atop an optical planarization layer (OPL) 104. In other embodiments, the stack of layers 101 may include additional or different layers. For example, EUV lithography may employ a "tri-layer" stack including a photoresist (PR)/anti-reflective coating (ARC)/optical planarization layer (OPL) from top to bottom. In other embodiments, the ARC layer may be replaced with a spin-on-glass (SOG) and other underlayers.

A plurality of patterning features, such as a plurality of photoresist lines 105, are formed over the stack of layers 101. In various embodiments, the plurality of photoresist lines 105 may form part of a larger pattern of features disposed on a silicon wafer or other substrate. Accordingly, the plurality of photoresist lines 105 may be characteristic of many other similar features disposed on the stack of layers 101, such as millions of other similar features. In some non-limiting embodiments, the plurality of photoresist lines 105 may be part of a metal oxide EUV resist.

In some embodiments, each of the plurality of photoresist lines 105 may have a uniform height 'H' across the device 100, as well as a uniform distance 'D' between adjacent photoresist lines. Because the geometries of the plurality of photoresist lines 105 are generally constant across the device 100, the plurality of photoresist lines 105 may be used to shadow the trenches 108 between the lines. In one embodiment, the ion incidence implant angle for an ion implantation may be chosen in such a way so just a portion of the sidewall surfaces 110 and an upper surface 112 of the plurality of photoresist lines 105 are implanted. Meanwhile, a bridge defect(s) 113 previously formed between two or more of the plurality of photoresist lines 105 is not affected. As shown, the bridge defect(s) 113 extends between two or more photoresist lines of the plurality of photoresist lines 105. Furthermore, the bridge defect(s) 113 is formed along an upper surface 118 of the stack of layers 101. In some examples, the bridge defect(s) 113 extends only partially up the sidewall surfaces 110 of the plurality of photoresist lines 105 from the stack of layers 101.

Figure 2:
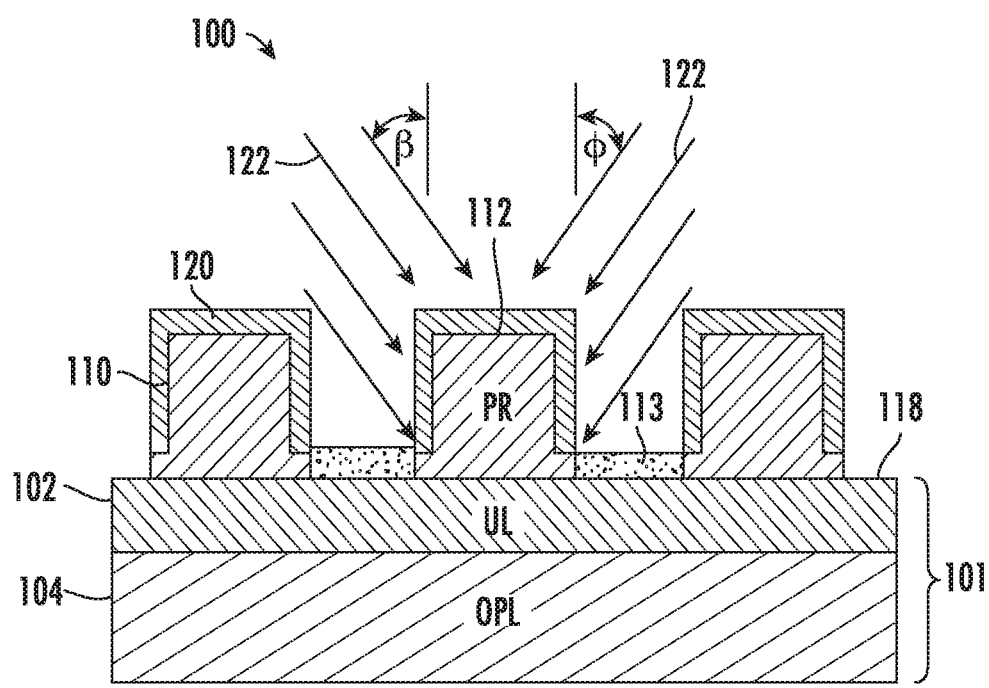
FIG. 2 depicts a side cross-sectional view of an approach for performing an ion implant to the plurality of photoresist lines of the semiconductor device of FIG. 1 in accordance with an embodiment of the present disclosure.

As shown in FIG. 2, a treated layer 120 is formed along just the sidewall surfaces 110 and the upper surfaces 112 of the plurality of photoresist lines 105 by implanting the sidewall surfaces 110 and the upper surfaces 112 with an ion beam 122. In exemplary embodiments, the ion beam 122 is disposed at a non-zero angle $\phi$ of inclination with respect to a perpendicular to a plane defined by the upper surface 118 of the stack of layers 101. As shown, the angle $\phi$ prevents the ion beam 122 from implanting the bridge defect(s) 113 within the trenches 108. In some non-limiting embodiments, the angle $\phi$ is greater than 35° relative to the perpendicular to the plane.

During operation, the ion beam 122 may be implanted while the device 100 is in a first position. Following formation of the treated layer 120 along one side of the plurality of photoresist lines 105, at the angle $\phi$, the device 100 is rotated (e.g., by 180 degrees), and another ion beam 122 implantation may be applied to the device 100 at a second angle $\beta$ to form the treated layer 120 along a second side of the plurality of photoresist lines 105. In exemplary embodiments, the angle $\phi$ and the second angle $\beta$ are the same. In other embodiments, the angle $\phi$ and the second angle $\beta$ vary.

In exemplary embodiments, the ion beam 122 implantation does not affect the thickness of the plurality of photoresist lines 105. Instead, the treated layer 120 may be a thin resist densification layer formed to a depth of approximately 5 nm. Although non-limiting, ions of the ion beam 122 may include Si, C, Ar, N, O, and Ge. The energy and dose of the ion implantation may be selected in a way to minimize damages to the photoresist lines 105 while still providing adequate etch resistance. In some embodiments, the ion energy is in the range of several hundred volts to a few keV, and the dose is on the order of E15 to E16 ions/cm². To prevent resist collapsing or tilting due to asymmetrical stress induced by ion implantation, the total dose may be divided into even portions of smaller doses on the order of E14 each, and be applied to each side of the photoresist lines 105 alternatively.

Figure 3:
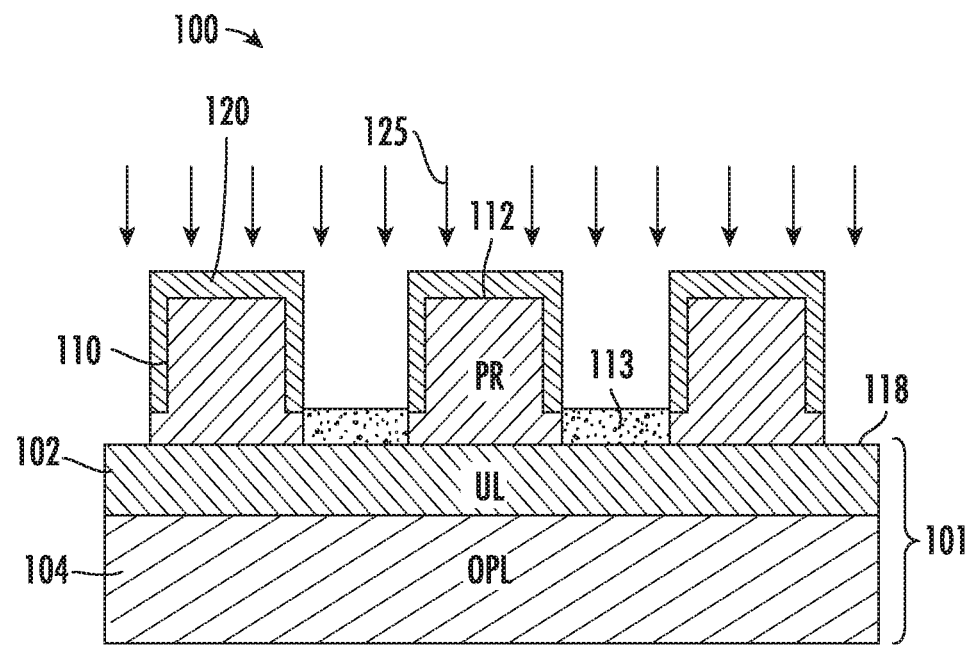
FIG. 3 depicts a side cross-sectional view of an approach for etching the semiconductor device of FIG. 2 in accordance with an embodiment of the present disclosure.
Figure 4:
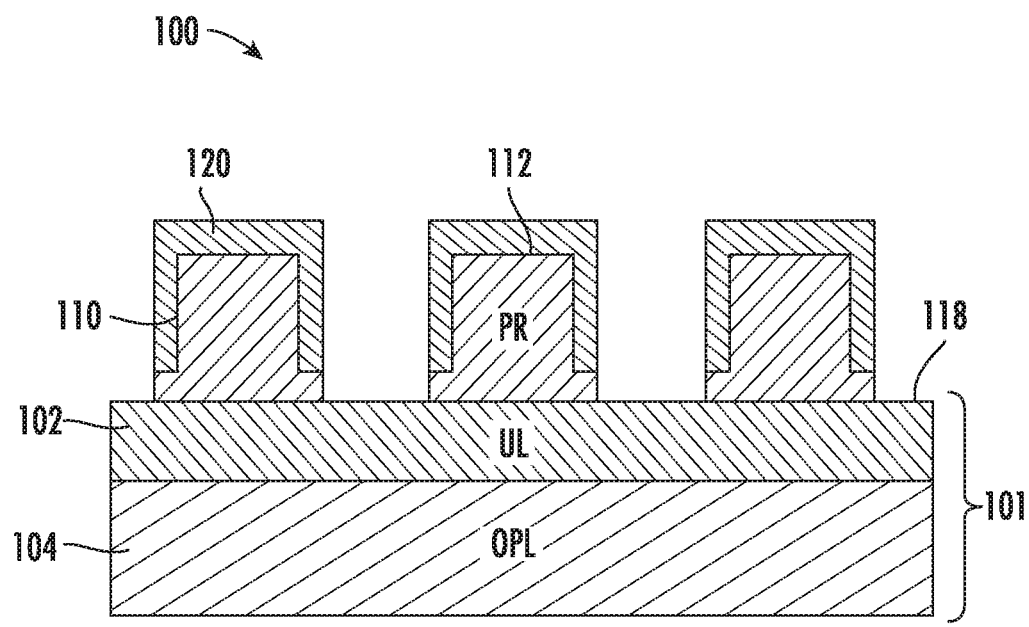
FIG. 4 depicts a side cross-sectional view of the semiconductor device of FIG. 3 following removal of bridge defects in accordance with an embodiment of the present disclosure.

Referring now to FIG. 3, the device 100 may be etched using an etch process 125, for example, a vertical/anisotropic reactive ion etch (RIE), resulting in the structure of the device 100 shown in FIG. 4. In exemplary embodiments, the etch process 125 to the plurality of photoresist lines 105 and to the bridge defect(s) 113 results in only the bridge defect(s) 113 being removed from the device 100. As shown, the bridge defect(s) 113 may be removed selective to the upper surface 118 of the stack of layers 101 and to the sidewall surfaces 110 of the photoresist lines 105. In non-limiting embodiments, the subsequent bridge defect removal step process may be carried out in a RIE etcher using $O_2$ or $H_2$ based plasma. There may be no need to apply bias to minimize damages, yet if some directionality is desirable to optimize resist profile, a low bias can be applied in the range of <1 kV.

Figure 5:
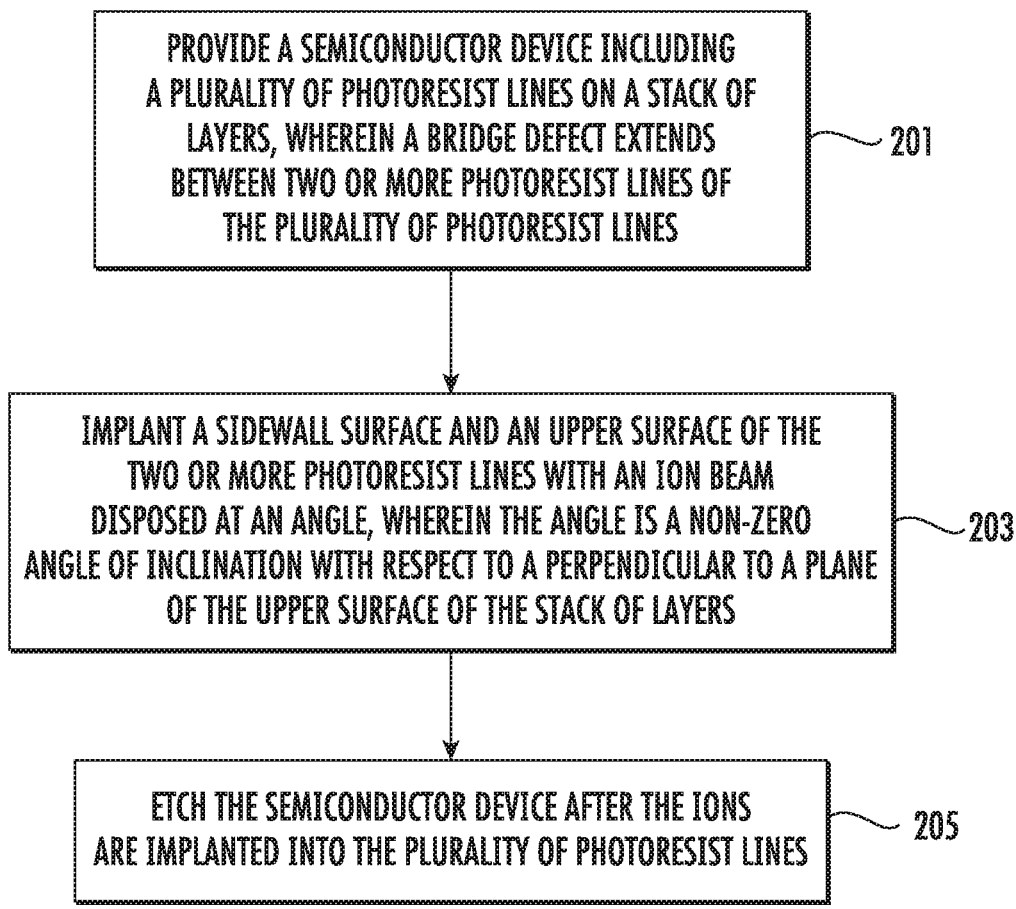
FIG. 5 is a flowchart illustrating an exemplary method according to the present disclosure.

Referring now to FIG. 5, a flow diagram illustrating an exemplary method 200 for removing bridge defects from a semiconductor device in accordance with the present disclosure is shown. The method 200 will be understood in conjunction with the representations shown in FIGS. 1-4.

At block 201, the method 200 includes providing a semiconductor device including a plurality of photoresist lines on a stack of layers, wherein a bridge defect extends between two or more photoresist lines of the plurality of photoresist lines. In some embodiments, the stack of layers includes an underlayer atop an OPL layer. In some embodiments, the bridge defect extends just partially up a sidewall of the plurality of photoresist lines. In some embodiments, the bridge defect extends along an upper surface of the stack of layers. In some embodiments, each of the plurality of photoresist lines has a uniform height.

At block 203, the method 200 may include implanting a sidewall surface and an upper surface of the two or more photoresist lines with an ion beam disposed at an angle, wherein the angle is a non-zero angle of inclination with respect to a perpendicular to a plane of the upper surface of the stack of layers. In some embodiments, the ion beam is implanted into just un upper portion of the sidewall. In some embodiments, the ion beam is implanted into the sidewall at a point just above the bridge defect. In other words, the ion beam angle is selected to prevent the ion beam from impacting the bridge defect. Implanting the sidewall surface and the upper surface of the two or more photoresist lines with the angled ion beam causes a hardened treatment layer to be formed along just an upper portion of the sidewall surface and along the upper surface of the two or more photoresist lines. In some embodiments, the ions are implanted at an angle nonparallel with the sidewall surface, for example, 35 degrees, or greater, relative to the sidewall surface.

At block 205, the method 200 may further include etching the semiconductor device after the ions are implanted into the plurality of photoresist lines. In some embodiments, the method may include etching the bridge defect between the plurality of photoresist lines. In some embodiments, the etch may be an anisotropic or isotropic reactive ion etch reactive ion etch. In exemplary embodiments, the hardened treatment layer prevents the etch from significantly removing material from the plurality of photoresist lines.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. One of skill in the art will understand various features of the certain aspects, embodiments, or configurations of the disclosure may be combined in alternate aspects, embodiments, or configurations. Moreover, the following claims are hereby incorporated into this Detailed Description by this reference, with each claim standing on its own as a separate embodiment of the present disclosure.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments also incorporating the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions, including conjunctive and disjunctive, in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure. The directional references do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer two elements are directly connected and in fixed relation to each other.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, although the illustrative method 200 is described above as a series of acts or events, the present disclosure is not limited by the illustrated ordering of such acts or events unless specifically stated. For example, some acts may occur in different orders and/or concurrently with other acts or events apart from those illustrated and/or described herein, in accordance with the disclosure. In addition, not all illustrated acts or events may be necessary to implement a methodology in accordance with the present disclosure. Furthermore, the method 200 may be implemented in association with the formation and/or processing of structures illustrated and described herein as well as in association with other structures not illustrated.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

In view of the foregoing, at least the following advantages are achieved by the embodiments disclosed herein. Firstly, angling an ion implant directed to just a sidewall surface of a patterning feature, such as one or more photoresist lines, prevents bridge defects formed between the one or more photoresist lines from being impacted and thus hardened. Secondly, the angled ion implant causes polymer fragmentation and densification within the photoresist, facilitating resist reflow and formation of a hardened treatment layer. Thirdly, the hardened treatment layer along the exposed surfaces of the photoresist lines allows the bridge defects to be removed without removing the photoresist lines, thus increasing overall device yield.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method comprising:
   providing a semiconductor device including a plurality of photoresist lines on a stack of layers, wherein a bridge defect extends between two or more photoresist lines of the plurality of photoresist lines; and
   implanting a sidewall surface and an upper surface of the two or more photoresist lines with an ion beam disposed at an angle, the angle being a non-zero angle of inclination with respect to a perpendicular to a plane of an upper surface of the stack of layers, wherein just the sidewall surface and the upper surface of the two or more photoresist lines are implanted without implanting the bridge defect.

2. The method of claim 1, further comprising etching the semiconductor device to remove the bridge defect.

3. The method of claim 2, further comprising removing the bridge defect selective to the upper surface of the stack of layers and to the plurality of photoresist lines.

4. The method of claim 2, wherein etching the semiconductor device comprises performing one of: an anisotropic reactive ion etch, and an isotropic reactive ion etch.

5. The method of claim 1, wherein the stack of layers comprises:
   an optical planarization layer; and
   an underlayer formed atop the optical planarization layer.

6. The method of claim 1, forming a treated layer along the sidewall surface and the upper surface of the two or more photoresist lines.

7. The method of claim 1, wherein the bridge defect is formed on the upper surface of the stack of layers.

8. A method for removing photoresist defects:
   providing a semiconductor device including plurality of photoresist lines on a stack of layers, wherein a bridge defect extends between two or more photoresist lines of the plurality of photoresist lines, and wherein the bridge defect is present along an upper surface of the stack of layers;
   forming a treated layer along just a sidewall surface and an upper surface of the two or more photoresist lines by implanting just the sidewall surface and the upper surface of the two or more photoresist lines with an ion beam disposed at an angle, the angle being a non-zero angle of inclination with respect to a perpendicular to a plane of the upper surface of the stack of layers; and
   etching the semiconductor device to remove the bridge defect.

9. The method of claim 8, further comprising implanting just an exposed portion of the sidewall surface and the upper surface of the two or more photoresist lines without implanting the bridge defect.

10. The method of claim 8, further comprising removing the bridge defect selective to the upper surface of the stack of layers and to the sidewall surface of the two or more photoresist lines of the plurality of photoresist lines.

11. The method of claim 8, wherein the stack of layers comprises:
    an optical planarization layer; and
    an underlayer formed atop the optical planarization layer.

12. The method of claim 8, wherein etching the semiconductor device comprises performing one of: an anisotropic reactive ion etch, and an isotropic reactive ion etch.

13. A method for selectively removing photoresist defects:
    providing a semiconductor device including plurality of photoresist lines on a stack of layers, wherein a bridge defect extends between two or more photoresist lines of the plurality of photoresist lines, and wherein the bridge defect is present along an upper surface of the stack of layers;
    forming a treated layer along just a sidewall surface and an upper surface of the two or more photoresist lines by implanting the sidewall and the upper surface of the two or more photoresist lines with an ion beam disposed at an angle, the angle being a non-zero angle of inclination with respect to a perpendicular to a plane of the upper surface of the stack of layers, and the angle preventing the ion beam from implanting the bridge defect; and
    etching the semiconductor device to remove the bridge defect.

14. The method of claim 13, further comprising removing the bridge defect selective to the upper surface of the stack of layers and to the sidewall surface of the two or more photoresist lines of the plurality of photoresist lines.

15. The method of claim 13, the stack of layers comprising:
    an optical planarization layer; and
    an underlayer formed atop the optical planarization layer.

16. The method of claim 13, wherein etching the semiconductor device comprises performing one of: an anisotropic reactive ion etch, and an isotropic reactive ion etch.

17. The method of claim 13, wherein the etching is applied to the plurality of photoresist lines and the bridge defect, and wherein just the bridge defect is removed.

18. The method of claim 13, further comprising providing the bridge defect just partially up the sidewall of the two or more photoresist lines.

19. The method of claim 13, the implanting comprising implanting, at a first implant angle, a first side of the two or more photoresist lines, and implanting, at a second implant angle, a second side of the two or more photoresist lines.

20. The method of claim 13, further comprising spacing the plurality of photoresist lines apart from one another by an approximately uniform distance, wherein the plurality of photoresist lines has an approximately uniform height from the upper surface of the stack of layers.

* * * * *